April 26, 1966 G. BESZEDICS 3,248,661

CONTROL ARRANGEMENT FOR AMPLIFIER STAGES

Filed April 25, 1962

INVENTOR.
GEZA BESZEDICS
BY Alfred C. Hill
AGENT 3,248,661
Patented Apr. 26, 1966

3,248,661

CONTROL ARRANGEMENT FOR AMPLIFIER STAGES

Geza Beszedics, Vienna, Austria, assignor to International Standard Electric Corporation, New York, N.Y., a corporation of Delaware Filed Apr. 25, 1962, Ser. No. 190,014
8 Claims. (Cl. 330—24)

Figure 1:
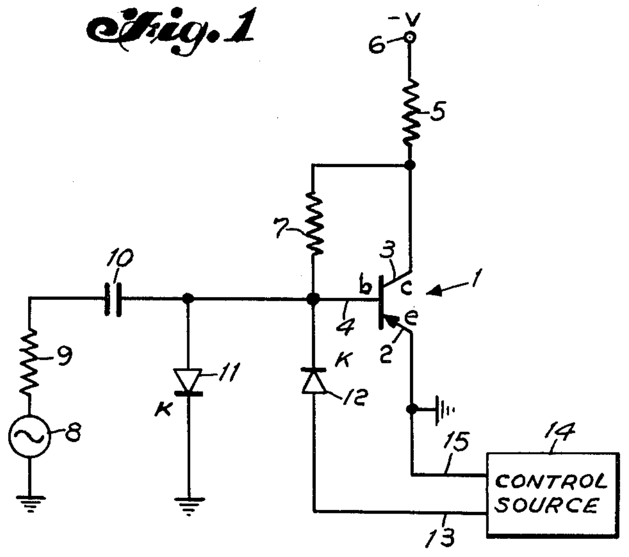

This invention relates to amplifier stages and more particularly to an improved circuit arrangement to control the conduction condition of an amplifier stage.

It is known than an amplifier stage may have its operating point and, hence, its conduction condition shifted from a first value to a second value by a control voltage to provide amplification at one operating point and a predetermined attenuation (suppression of amplification) at the other operating point. In certain applications the resultant attenuation may be less than a desired predetermined value and may actually vary due to fluctuations of the control voltage. This is the situation when, for example, some highly fluctuating control voltages derived from voice currents are employed to control the conduction condition of the amplifier stage. In such an application measures must be taken to stabilize the input impedance and the operating points for both amplification and attenuation of the amplifier to provide the desired amplification or attenuation of a signal coupled to the input of the amplifier stage. This is necessary since the fluctuating control voltage will cause a variation of both the operating points of the amplifier stage and the input impedance of the amplifier stage to the extent that the previous stage due to the power matching necessity will counteract the desired attenuation and amplification.

An object of this invention is the provision of an improved circuit arrangement to control the conduction condition of an amplifier stage overcoming the above-mentioned difficulties.

Another object of this invention is the provision of an improved circuit arrangement to control the conduction condition of an amplifier stage in which a predetermined input impedance and predetermined operating points of the amplifier stage are maintained regardless of variations of the control voltage.

A feature of this invention is to provide in conjunction with an amplifier having at least a first electrode emitting electrical energy carriers, a second electrode collecting said carriers, and a third electrode to control the flow of said carriers between the first and second electrodes, a control network including a first unidirectional device coupled between the third electrode and the first electrode poled to conduct in a given direction therethrough to determine the input impedance of the amplifier, a source of control signal having first and scond output terminals, the second output terminal being coupled to the first electrode, and a second unidirectional device coupled between the third electrode and the first output terminal poled to conduct therethrough in a direction opposite to said given direction to control the operating point of said amplifier in accordance with the polarity of the control signal.

Another feature of this invention is to provide an impedance network, either as an integral part of the control source or as an addition thereto, coupled to the second unidirectional device having a magnitude in the order of the conducting resistance of the second unidirectional device in the frequency range of the signal to be amplified enabling the second unidirectional device to reduce the nonlinear distortions during the control or switching process and increase the attenuation during the attenuating period.

A further feature of this invention is to provide an impedance network coupled between the third electrode and the two unidirectional devices to enable adjustment of the magnitude and/or characteristic of the attenuation.

Figure 2:
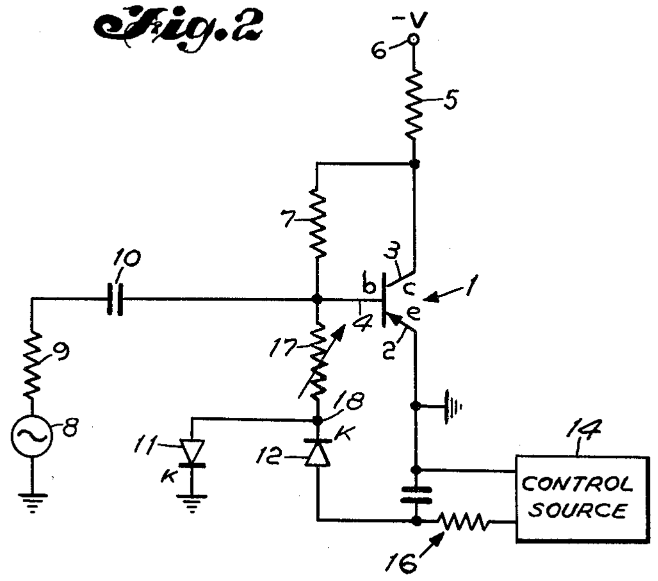

The above-mentioned and other features and objects of this invention will become more apparent by reference to the following description taken in conjunction with the accompanying drawings, in which:

FIG. 1 is a schematic diagram of an amplifier stage incorporating the control arrangement in accordance with the principles of this invention; and FIG. 2 is a schematic diagram illustrating a modification of the control arrangement of FIG. 1.

Referring to FIG. 1, there is illustrated therein transistor 1, illustrated as a pnp type transistor, having emitter electrode 2 for emitting electrical energy carriers, collector electrode 3 for collecting the energy carriers, and base electrode 4 to control the flow of energy carriers between electrodes 2 and 3. Emitter electrode 2 is coupled to a reference potential, illustrated as ground, and collector electrode 3 is coupled by means of resistor 5 to an operating voltage source coupled to terminal 6. Resistor 7 couples electrode 3 to electrode 4. An alternating current source 8, for instance, a transducer controlled by the human voice, is connected by its internal resistance 9 and coupling condenser 10 to the input, base electrode 4, of the transistor 1.

The circuit arrangement just described is known in the art. It should be further understood than an npn type transistor could be sutbstituted for the illustrated pnp transistor with the accompanying change of polarity of the supply voltage coupled to terminal 6. Thus, the illustration and description which follows is not meant to limit the control arrangement for operation with the illustrated pnp transistor but may just as well be employed with an npn type transistor.

According to the principles of this invention at least two unidirectional devices, illustrated for purposes of explanation as diodes 11 and 12, are coupled to transistor 1 as illustrated. Although only two diodes 11 and 12 are illustrated in FIG. 1, it is to be understood that the invention is not limited to the use of only two unidirectional devices.

The first unidirectional device, diode 11, is connected between base electrode 4 and the reference potential (ground). This connection effectively connects diode 11 between base electrode 4 and emitter electrode 2. Diode 11 is poled to conduct from base electrode 4 to emitter electrode 2. By this connection diode 11 determines the input impedance of the transistor amplifier stage.

The second unidirectional device, diode 12, is connected between base electrode 4 and terminal 13 of control source 14. Control source 14 provides a direct current control voltage which may, for example, be derived from the voice voltage of another amplifier stage incorporated in the equipment cooperating with the transistor amplifier stage including transistor 1. Terminal 15 of source 14 is connected to emitter 2 via means of a direct connection thereto or through the medium of the reference potential (ground). Diode 12 is poled to conduct in a direction opposite to the conduction direction of diode 11 and, thus, by this connection diode 12 determines the operating point of the amplifier stage.

If a positive control voltage is present at terminal 13 and a negative voltage at terminal 15, diode 12 will conduct and transistor 1 will be blocked or have suppressed amplification, that is, will present a predetermined attenuation to the signal of source 8.

However, if a negative voltage is present at terminal 13, and a positive voltage is present at terminal 15, diode 12 is rendered non-conductive and transistor 1 is switched to its amplification condition. The negative control voltage on terminal 13 may assume any value and not disturb the operating point of transistor 1 in its amplification condition due to the blocking action of diode 12. Thus, an increasing negative potential control signal on terminal 13 cannot influence or vary the operating point of transistor 1 in its amplification condition and, thus, the amplification of transistor 1 will not vary. The negative control voltage at terminal 13 may be derived, for example, from the absence of the above-described voice current of another amplifier stage.

Referring to FIG. 2, there is illustrated a modification of the transistor amplifier stage of FIG. 1. Common components of FIGS. 1 and 2 function as described hereinabove with respect to FIG. 1 and are identified by the same reference characters employed in the description of FIG. 1.

One modification to the circuit of FIG. 1 enables an increase of the attenuation in the attenuation condition of transistor 1 and a reduction in the nonlinear distortions present in the controlling or switching processes. This is accomplished by coupling to the output of source 14 an impedance network 16 having an impedance value in the order of magnitude of the conducting resistance of diode 12 in the frequency range of the signal from source 8 to be amplified. The impedance network 16 operates to match the impedance of diode 12 to prevent the dissipation of power in the control source and to bypass the frequencies of the signals being amplified. It is to be understood that control source 14 could include an internal impedance which will accomplish the same result as the external impedance 16.

A further modification to the circuit of FIG. 1 enables the adjustment of the magnitude and/or characteristic of the attenuation presented by transistor 1. This is accomplished by inserting an impedance, such as resistor 17, between base electrode 4 and junction 18 of the diodes 11 and 12. Although the impedance between electrode 4 and point 18 is illustrated as a resistor 17, an inductance could perform the same function.

While I have described above the principles of my invention in connection with specific apparatus, it is to be clearly understood that this description is made only by way of example and not as a limitation to the scope of my invention as set forth in the objects thereof and in the accompanying claims.

I claim:

1. A circuit arrangement to control the conduction condition of an amplifier stage comprising:

an amplifier having at least a first electrode emitting electrical energy carriers, a second electrode collecting said carriers, and a third electrode to control the flow of said carriers between said first and second electrodes;

a source of operating material;

a first resistor coupled between said source of operating potential and said second electrode;

a second resistor coupled between said second electrode and said third electrode;

ground potential;

said first electrode being connected directly to said ground potential;

a source of signals to be operated upon by said amplifier coupled between said third electrode and said ground potential;

a first unidirectional device coupled between said third electrode and said ground potential poled to conduct in a given direction therethrough to determine the input impedance of said amplifier;

a source of control signal having a first output terminal and a second output terminal, said second output terminal being connected directly to said ground potential; and a second unidirectional device coupled between said third electrode and said first output terminal poled to conduct therethrough in a direction opposite to said given direction to control the operating point of said amplifier in accordance with the polarity of said control signal.

2. A circuit arrangement according to claim 1, wherein said source of control signal includes an impedance network to match the impedance of said second device in the operating frequency range of said amplifier stage to enable said second device to reduce the nonlinear distortions during the control process and to increase the attenuation during the attenuating period.

3. A circuit arrangement according to claim 1, further including an impedance coupled between said third electrode and said first and second devices to adjust the attenuation of said amplifier stage.

4. A circuit arrangement according to claim 1, wherein:

said source of control signal includes an impedance network to match the impedance of said second device in the operating frequency range of said amplifier stage to enable said second device to reduce the nonlinear distortions during the control process and to increase the attenuation during the attenuating period; and an impedance is coupled between said third electrode and said first and second devices to adjust the attenuation of said amplifier stage.

5. A circuit arrangement to control the conduction condition of an amplifier stage comprising:

a pnp type transistor having at least an emitter electrode, a collector electrode, and a base electrode;

a source of operating potential;

a first resistor coupled between said source of operating potential and said collector electrode;

a second resistor coupled between said collector electrode and said base electrode;

ground potential;

said emitter electrode being connected directly to said ground potentials;

a source of signals to be operated upon by said transistor coupled between said base electrode and said ground potential;

a first diode having its anode coupled to said base electrode and its cathode connected directly to said ground potential to determine the input impedance of said transistor;

a source of control signal having a first output terminal and a second output terminal, said second output terminal being connected directly to said ground potential; and a second diode having its cathode coupled to said base electrode and its anode coupled to said first output terminal to control the operating point of said transistor in accordance with the polarity of said control signal.

6. A circuit arrangement according to claim 5, wherein said source of control signal includes an impedance network to match the impedance of said second diode in the operating frequency range of said amplifier stage to enable said second diode to reduce the nonlinear distortions during the control process and to increase the attenuation during the attenuating period.

7. A circuit arrangement according to claim 5, further including an impedance having one end thereof connected directly to said base electrode and the other end thereof connected directly in common to the anode of said first diode and the cathode of said second diode to adjust the attenuation of said amplifier stage.

8. A circuit arrangement according to claim 5, wherein said source of control signal includes an impedance network to match the impedance of said second diode in the operating frequency range of said amplifier stage to enable said second diode to reduce the nonlinear distortions during the control process and to increase the attenuation during the attenuating period; and an impedance having one end thereof connected directly to said base electrode and the other end thereof connected directly in common to the anode of said first diode and the cathode of said second diode to adjust the attenuation of said amplifier stage.

References Cited by the Examiner

UNITED STATES PATENTS

| | | | |
|---|---|---|---|
| 2,863,118 | 12/1958 | Pihl | 330—203 X |
| 2,892,165 | 6/1959 | Lindsay | 330—24 X |
| 2,999,169 | 9/1961 | Feiner | 307—88.5 |
| 3,133,242 | 5/1964 | Harries | 330—24 X |

FOREIGN PATENTS

| | | |
|---|---|---|
| 203,244 | 5/1959 | Austria. |

ROY LAKE, *Primary Examiner.*

NATHAN KAUFMAN, *Examiner.*